(12) United States Patent
Kim

(10) Patent No.: US 8,659,063 B2
(45) Date of Patent: Feb. 25, 2014

(54) PIN CAPACITOR OF SEMICONDUCTOR DEVICE AND METHOD FOR FABRICATING THE SAME

(75) Inventor: Jeong-Soo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 507 days.

(21) Appl. No.: 12/963,228

(22) Filed: Dec. 8, 2010

(65) Prior Publication Data

US 2011/0215388 A1 Sep. 8, 2011

(30) Foreign Application Priority Data

Mar. 3, 2010 (KR) .................. 10-2010-0019161

(51) Int. Cl.
*H01L 27/01* (2006.01)
(52) U.S. Cl.
USPC ..... 257/296; 257/516; 257/534; 257/E27.048
(58) Field of Classification Search
USPC .......................................... 257/534
See application file for complete search history.

(56) References Cited

U.S. PATENT DOCUMENTS

| | | | | |
|---|---|---|---|---|
| 6,128,209 A | * | 10/2000 | Kuroki | ............... 365/63 |
| 6,255,697 B1 | * | 7/2001 | Yoo et al. | ....................... 257/365 |
| 7,271,431 B2 | * | 9/2007 | Lin et al. | ....................... 257/288 |
| 7,317,238 B2 | * | 1/2008 | Kang et al. | ..................... 257/534 |
| 2004/0245604 A1 | * | 12/2004 | Shapira et al. | ................ 257/599 |
| 2005/0133886 A1 | * | 6/2005 | Kao et al. | ....................... 257/534 |

FOREIGN PATENT DOCUMENTS

| | | |
|---|---|---|
| KR | 1020020085960 | 11/2002 |
| KR | 1020050012610 | 2/2005 |
| KR | 100660720 | 12/2006 |
| KR | 100769145 | 10/2007 |

OTHER PUBLICATIONS

Notice of Preliminary Rejection issued from Korean Intellectual Property Office on Jun. 27, 2011.
Notice of Allowance issued by the Korean Intellectual Property Office on Mar. 29, 2012.

* cited by examiner

*Primary Examiner* — Stephen W Smoot
(74) *Attorney, Agent, or Firm* — IP & T Group LLP

(57) ABSTRACT

A pin capacitor of a semiconductor device includes a first isolation layer formed in a substrate and defining a dummy active area, a plurality of gates formed over the first isolation layer, a spacer formed at both sidewalls of each of the gates, and a plug formed over the dummy active area and in contact with the spacer. The substrate and the plug are coupled to a ground unit, and the gate is coupled to a pad unit. That is, the pin capacitor includes a first capacitor including the gate, the isolation layer, and the substrate and a second capacitor including the gate, the spacer, and the plug, which are coupled in parallel to each other.

12 Claims, 7 Drawing Sheets

PIN CAPACITOR OF SEMICONDUCTOR DEVICE AND METHOD FOR FABRICATING THE SAME

CROSS-REFERENCE TO RELATED APPLICATION

The present application claims priority of Korean Patent Application No. 10-2010-0019161, filed on Mar. 3, 2010, which is incorporated herein by reference in its entirety.

BACKGROUND OF THE INVENTION

Exemplary embodiments of the present invention relate to a technology for fabricating a semiconductor device, and more particularly, to a pin capacitor of a semiconductor device, which is coupled to a pad, and a method for fabricating the same.

Semiconductor devices such as a DRAM include a pin capacitor which is positioned in a pad area and coupled between a pad and a ground, in order to reduce noise occurring during power supply and data input/output through the pad.

FIGS. 1A and 1B are diagrams illustrating a pin capacitor of a conventional semiconductor device. FIG. 1A is a plan view of the pin capacitor, and FIG. 1B is a cross-sectional view taken along a line X-X' in FIG. 1A.

Referring to FIGS. 1A and 1B, the pin capacitor of the conventional semiconductor device includes an isolation layer 12, a gate 17, and a pickup area 14. The isolation layer 12 is formed in a substrate 11 to define a dummy active area 13. The gate 17 is formed on the isolation layer 12 at both sides of the dummy active area 13, and includes a gate electrode 15 and a gate hard mask layer 16 which are sequentially stacked. The pickup area 14 is formed in the substrate 11. At this time, the pin capacitor has a structure in which the substrate 11, the isolation layer 12, and the gate 17 are stacked. The gate 17, the isolation layer 12, and the substrate 11 serve as an upper electrode, a dielectric, and a lower electrode, respectively. The gate 17 is coupled to a pad unit 101, and the pickup area 14 is coupled to a ground unit 102.

In order to increase the integration degree of a semiconductor device, the size of a pad tends to be reduced. Accordingly, the size of the gate 17 of the pin capacitor formed in the pad area is also reduced gradually. As the size of the gate 17 is reduced, the capacitance of the pin capacitor may decrease. Furthermore, as the capacitance of the pin capacitor decreases, the reliability of the semiconductor device may be degraded.

SUMMARY OF THE INVENTION

An embodiment of the present invention is directed to a semiconductor device capable of improving the capacitance of a pin capacitor and a method for fabricating the same.

In accordance with an embodiment of the present invention, a pin capacitor of a semiconductor device includes: a first isolation layer formed in a substrate and defining a dummy active area; a plurality of gates formed over the first isolation layer; a spacer formed at both sidewalls of each of the gates; and a plug formed over the dummy active area and in contact with the spacer. The substrate and the plug are coupled to a ground unit, and the gate is coupled to a pad unit.

In accordance with another embodiment of the present invention, a method for fabricating a pin capacitor of a semiconductor device includes: forming first and second isolation layers having different widths in a substrate, and defining a plurality of dummy active areas in the substrate; forming a plurality of gates over the first isolation layer; forming a spacer at both sidewalls of each of the gates, and forming a third isolation layer over the second isolation layer; and forming a plug over the dummy active areas so as to fill the space between the spacer and the third isolation layer.

In accordance with still another embodiment of the present invention, a pin capacitor of a semiconductor device, comprising: a substrate having a isolation layer and a dummy active area defined by the isolation layer; a first capacitor formed between the substrate and a pad of the semiconductor device; and a second capacitor formed the pad and a plug formed over the dummy active area, wherein the first and second capacitors include a gate formed over the isolation area and are coupled in parallel to each other.

DESCRIPTION OF SPECIFIC EMBODIMENTS

Figure 1A:
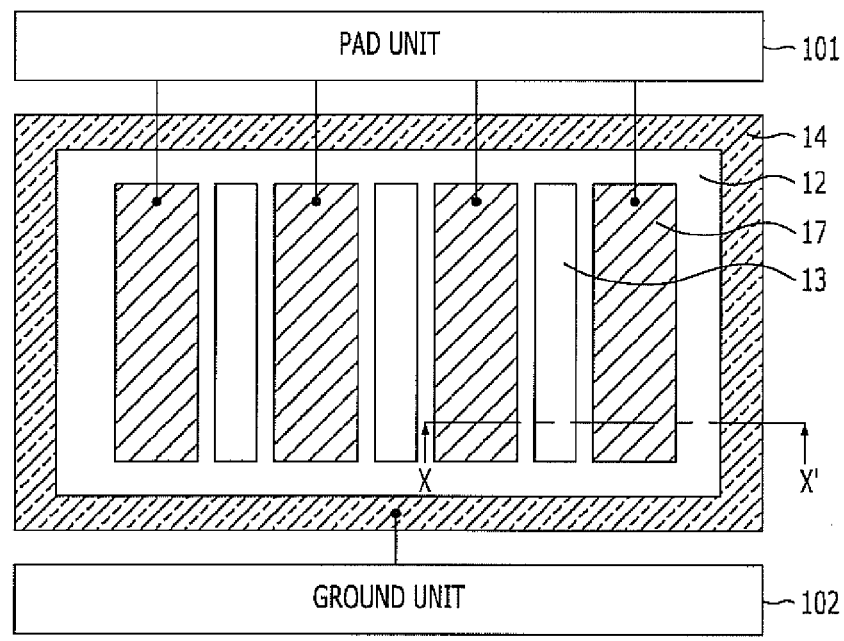
FIG. 1A is a plan view of a pin capacitor of a conventional semiconductor device.
Figure 1B:
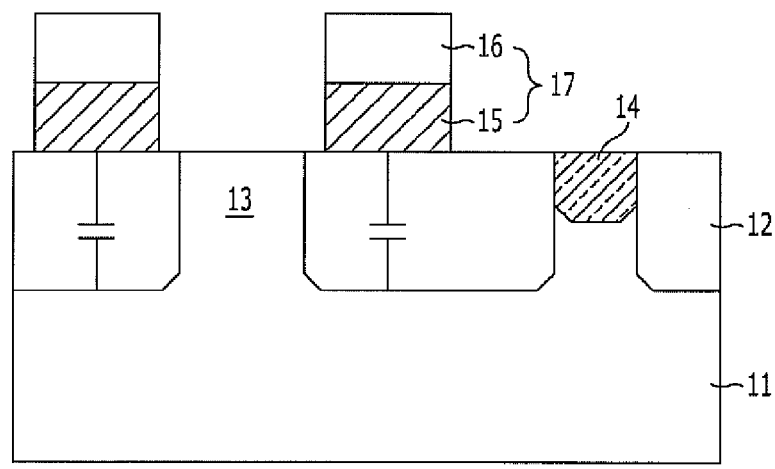
FIG. 1B is a cross-sectional view of the pin capacitor of the conventional semiconductor device, taken along a line X-X' in FIG. 1A.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Exemplary embodiments of the present invention provide a semiconductor device which is capable of increasing the capacitance of a pin capacitor formed under a pad, even though the size of the pad is reduced as the integration degree of the semiconductor device increases, and a method for fabricating the same. The pin capacitor in accordance with the embodiments of the present invention may be characterized in that a first capacitor including an isolation layer as a dielectric and a second capacitor including a spacer formed on gate sidewalls as a dielectric are coupled to each other in parallel.

Figure 2A:
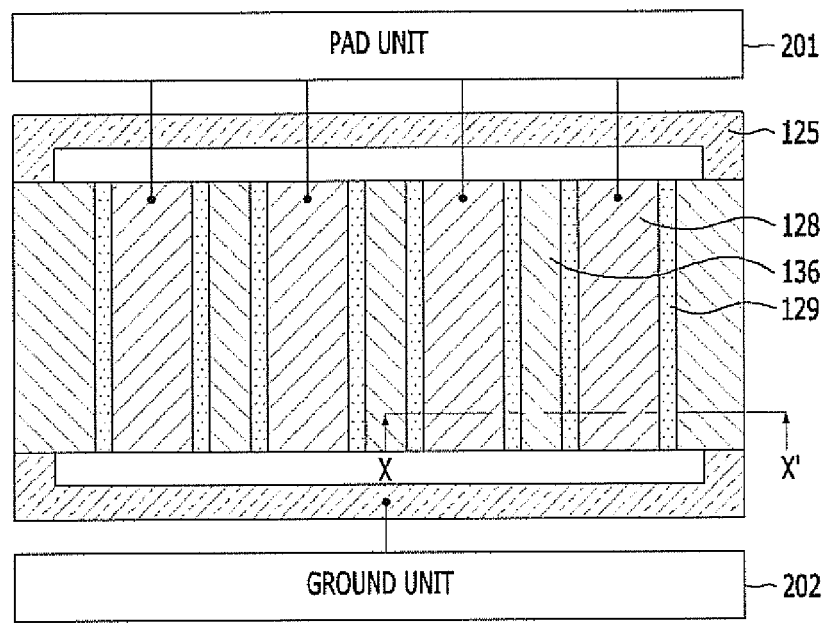
FIG. 2A is a plan view of a pin capacitor of a semiconductor device in accordance with a first embodiment of the present invention.
Figure 2B:
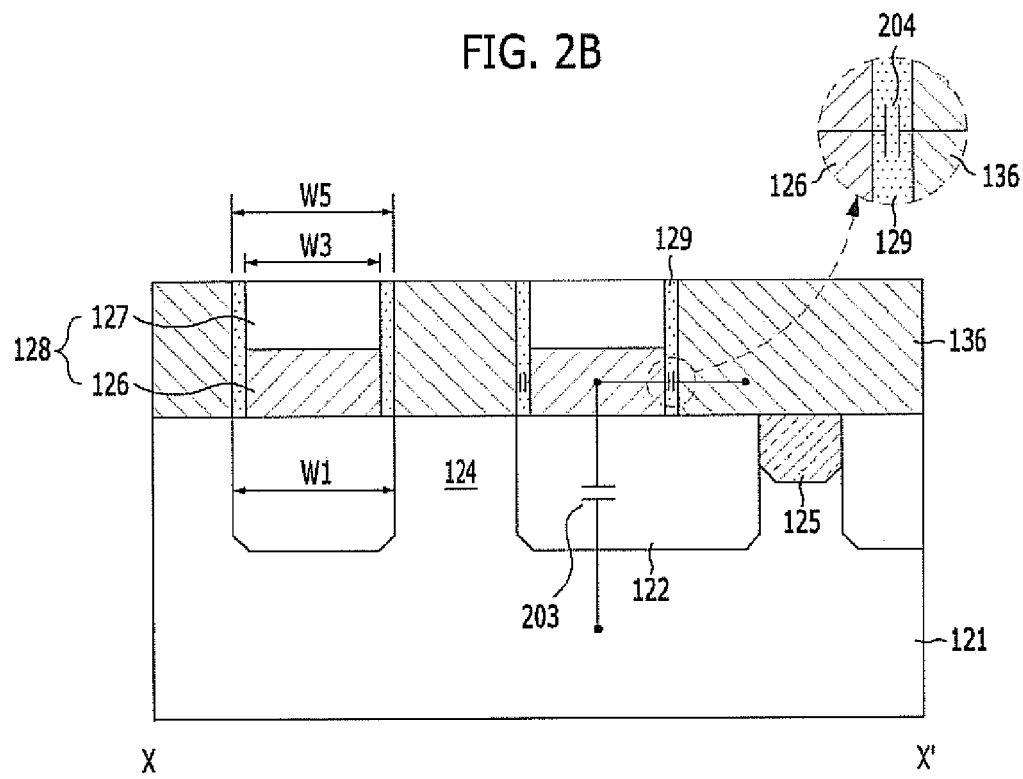
FIG. 2B is a cross-sectional view of the pin capacitor of the semiconductor device in accordance with the first embodiment of the present invention, taken along a line X-X' in FIG. 2A.

FIGS. 2A and 2B are diagrams illustrating a pin capacitor in accordance with a first embodiment of the present invention. FIG. 2A is a plan view of the pin capacitor, and FIG. 2B is a cross-sectional view taken along a line X-X' of FIG. 2A.

Referring to FIGS. 2A and 2B, the pin capacitor in accordance with the first embodiment of the present invention includes an isolation layer 122, a gate 128, a spacer 129, and a plug 136. The isolation layer 122 is formed in a substrate 121 to define a dummy active area 124. The gate 128 is formed on the isolation layer 122, and has a multilayer structure in which a gate electrode 126 and a gate hard mask layer 127 are stacked. The spacer 129 is formed at both sidewalls of the gate 128. The plug 136 is formed over the substrate 121 having the dummy active area 124 in contact with the spacer 129. Furthermore, the pin capacitor includes a pickup area 125 which is formed in the substrate 121 and surrounds the gate 128.

At this time, the pickup area 125 serves as a guard ring for the pin capacitor as well as a contact for applying bias to the substrate 121. Furthermore, the pickup area 125 may have the same conductive type as the substrate 121, and have an impurity doping concentration which is higher than that of the substrate 121.

The isolation layer 122 defining the dummy active area 124 may be formed through a shallow trench isolation (STI) process, and may include a single layer formed of any one selected from the group consisting of oxide, nitride, and nitrided oxide or a multilayer in which the single layers are stacked. For example, the isolation layer 122 may include a multilayer in which a sidewall oxide layer, a liner nitride layer, a liner oxide layer, and a buried oxide layer are sequentially stacked. The sidewall oxide layer, the liner nitride layer, the liner oxide layer, and the buried oxide layer are not illustrated in FIGS. 2A and 2B. For reference, the isolation layer 122 serves as a dielectric of a first capacitor 203 composing the pin capacitor. Therefore, the isolation layer 122 may be formed of a material having a large dielectric constant, in order to increase the capacitance of the pin capacitor.

The gate 128 formed on the isolation layer 122 has a multilayer structure in which the gate electrode 126 and the gate hard mask layer 127 are sequentially stacked. Although not illustrated, the gate 128 may further include a gate dielectric layer interposed between the isolation layer 122 and the gate electrode 126.

The width W3 of the gate 128 may be set to be smaller than the width W1 of the isolation layer 122, and the sum of the widths W4 of the spacers 129 formed at both sidewalls of the gate 128 and the width W3 of the gate 128 (W3+2×W4) may be set to be smaller than the width W1 of the isolation layer 122. In this case, the gate electrode 126 may be substantially prevented from being electrically coupled to the dummy active area 124, and the contact area between the plug 136 and the dummy active area 124 may be secured as much as possible.

The spacer 129 formed at both sidewalls of the gate 128 may include a single layer formed of any one selected from the group consisting of oxide, nitride, and nitrided oxide or a multilayer in which the single layers are stacked. For reference, since the spacer 129 serves as a dielectric of a second capacitor 204 composing the pin capacitor, the spacer 129 may be formed of a material having a large dielectric constant, in order to increase the capacitance of the pin capacitor.

In the pin capacitor of the semiconductor device in accordance with the first embodiment of the present invention, the gate 128, the isolation layer 122, and the substrate 121 play a role as the first capacitor 203 of the pin capacitor, and serve as an upper electrode, a dielectric, and a lower electrode, respectively. The gate 128, the spacer 129, and the plug 136 play a role as the second capacitor 204 of the pin capacitor, and serve as an upper electrode, a dielectric, and a lower electrode, respectively. At this time, when the gate 128 is coupled to a pad unit 201 and the plug 136, the pickup area 125, and the substrate 121 are coupled to a ground unit 202, the entire capacitance of the pin capacitor may be controlled by adjusting the number of gates 128 coupled to the pad 201 and the number of plugs 136 coupled to the ground unit 202. For reference, the substrate 121 is coupled to the ground unit 202 through the pickup area 125. In some cases, however, the substrate 121 may be directly coupled to the ground unit 202 without the pickup area 125.

Furthermore, the pin capacitor in accordance with the first embodiment of the present invention includes the second capacitor 204 composed of the plug 136, the spacer 129, and the gate 128 as well as the first capacitor 203. Therefore, the capacitance of the pin capacitor may be increased for the same area as compared to the conventional capacitor.

Furthermore, as the first capacitor 203 and the second capacitor 204 are coupled in parallel to each other, the capacitance of the pin capacitor may be further increased.

Accordingly, although the area of the pad is reduced as the integration degree of the semiconductor device increases, the capacitance of the pin capacitor formed under the pad may be increased. Therefore, noise occurring during power supply and data input/output through the pad may be effectively reduced. Furthermore, the reliability of the semiconductor device may be increased.

Hereafter, a pin capacitor of a semiconductor device in accordance with a second embodiment of the present invention is described with reference to FIGS. 3A and 3B. In accordance with the second embodiment of the present invention, the capacitance of the pin capacitor may be further increased as compared the pin capacitor in accordance with the first embodiment of the present invention.

Figure 3A:
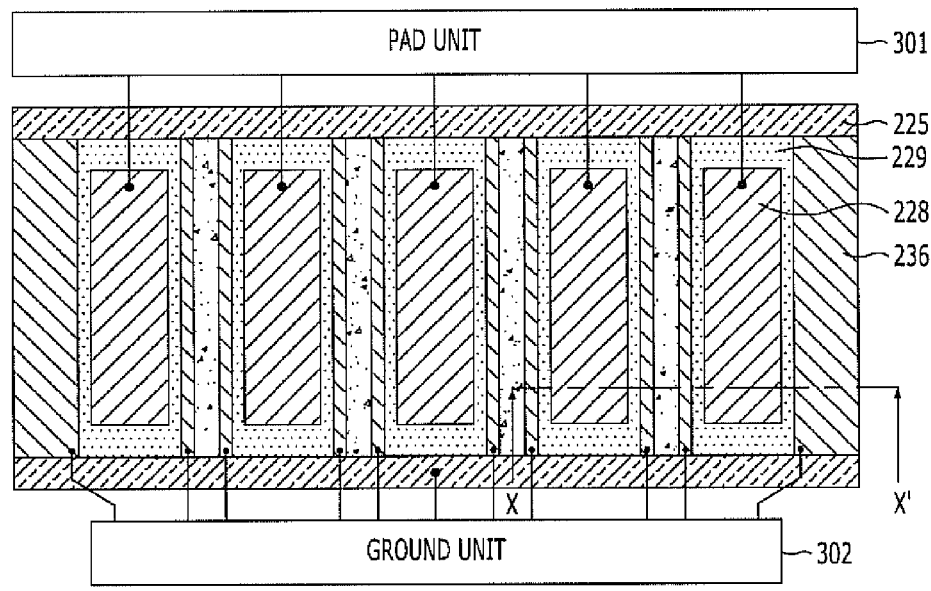
FIG. 3A is a plan view of a pin capacitor of a semiconductor device in accordance with a second embodiment of the present invention.
Figure 3B:
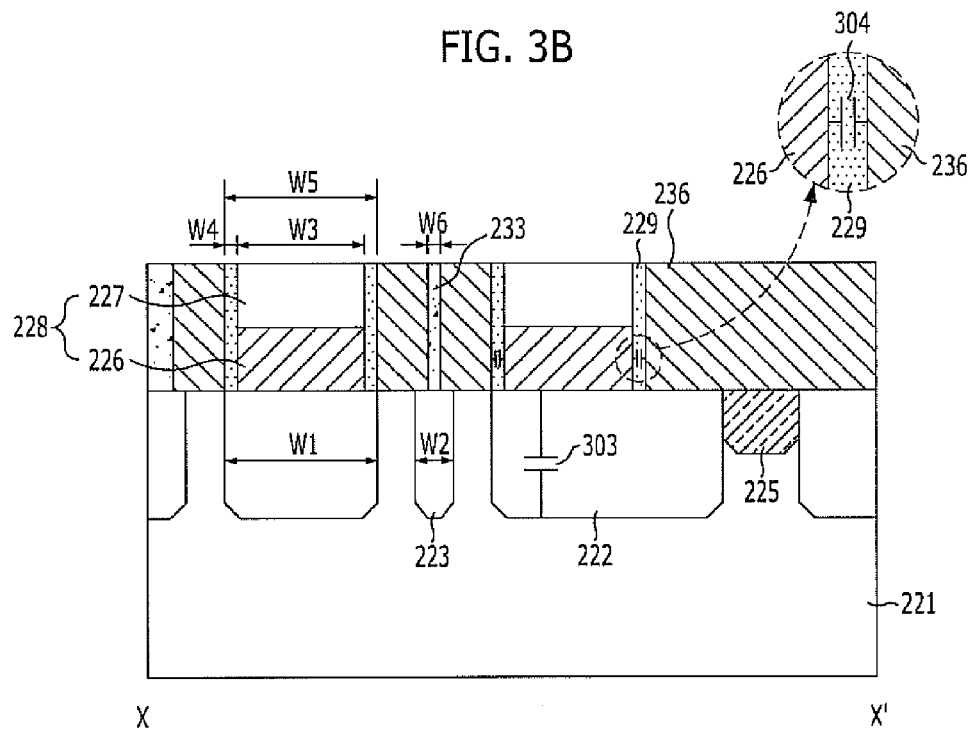
FIG. 3B is a cross-sectional view of the pin capacitor of the semiconductor device in accordance with the second embodiment of the present invention, taken along a line X-X' in FIG. 3A.

FIGS. 3A and 3B are diagrams illustrating the pin capacitor of the semiconductor device in accordance with the second embodiment of the present invention. FIG. 3A is a plan view of the pin capacitor, and FIG. 3B is a cross-sectional view taken along a line X-X' in FIG. 3A.

Referring to FIGS. 3A and 3B, the pin capacitor of the semiconductor device in accordance with the second embodiment of the present invention includes first and second isolation layers 222 and 223, a plurality of gates 228, a spacer 229, a plug 236, and a third isolation layer 233. The first and second isolation layers 222 and 223 are formed in a substrate 221 to define a plurality of dummy active areas 224, and have a different width from each other. The plurality of gates 228 are formed on the first isolation layer 222. The spacer 229 is formed at both sidewalls of the gate 228. The plug 236 is formed on the substrate 221 having the dummy active area 224 in contact with the spacer 229. The third isolation layer 233 is formed on the second isolation layer 223 and electrically isolates the adjacent plugs 236 from each other. The pin capacitor further includes a pickup area 225 which is formed in the substrate 221 and surrounds the gates 228. At this time, the pickup area 225 serves as a guard ring for the pin capacitor as well as a contact for applying bias to the substrate 221. Furthermore, the pickup area 225 may have the same conductive type as the substrate 221, and have an impurity doping concentration which is higher than that of the substrate 221.

In the first and second isolation layers 222 and 223 which define the plurality of dummy active areas 124 and have different widths, the width W1 of the first isolation layer 222 is larger than the width W2 of the second isolation layer 223. The first and second isolation layers 222 and 223 are alternately arranged. That is, the second isolation layer 223 is disposed between the first isolation layers 222, and the first isolation layer 222 is disposed between the second isolation layers 223.

The first and second isolation layers 222 and 223 may be formed through an STI process, and may include a single layer formed of any one selected from the group consisting of oxide, nitride, and nitrided oxide or a multilayer in which the single layers are stacked. For example, the first and second isolation layers 222 and 223 may include a multilayer in which a sidewall oxide layer, a liner nitride layer, a liner oxide layer, and a buried oxide layer are sequentially stacked. The sidewall oxide layer, the liner nitride layer, the liner oxide layer, and the buried oxide layer are not illustrated in FIGS. 3A and 3B. For reference, the first isolation layer 222 serves as a dielectric of the first capacitor 303 composing the pin capacitor. Therefore, the isolation layer 222 may be formed of a material having a large dielectric constant, in order to increase the capacitance of the pin capacitor.

The gate 228 formed on the first isolation layer 222 has a multilayer structure in which the gate electrode 226 and the gate hard mask layer 227 are sequentially stacked. Although not illustrated, the gate 228 may further include a gate dielectric layer interposed between the first isolation layer 222 and the gate electrode 226.

The width W3 of the gate 228 may be set to be smaller than the width W1 of the first isolation layer 222, and the sum of the widths W4 of the spacers 229 formed at both sidewalls of the gate 228 and the width W3 of the gate 228 (W3+2×W4) may also be set to be smaller than the width W1 of the first isolation layer 222. In this case, the gate electrode 226 may be substantially prevented from being electrically coupled to the dummy active area 224, and the contact area between the plug 236 and the dummy active area 224 may be secured as much as possible.

The spacer 229 formed at both sidewalls of the gate 228 may include a single layer formed of any one selected from the group consisting of oxide, nitride, and nitrided oxide or a multilayer in which the single layers are stacked. For reference, since the spacer 229 serves as a dielectric of the second capacitor 304 composing the pin capacitor, the spacer 229 may be formed of a material having a large dielectric constant, in order to increase the capacitance of the pin capacitor.

The third isolation layer 223 isolating the adjacent plugs 236 may be formed in such a structure as to pass through the plug 236 positioned between the gates 228, and serves to increase the number of second capacitors 304 by isolating the plugs 236.

The third isolation layer 233 is positioned on the second isolation layer 223, and the width W6 of the isolation layer 233 may be set to be smaller than the width W2 of the second isolation layer 223. In this case, the contact area between the plug 236 and the dummy active area 224 may be secured as much as possible.

In the pin capacitor of the semiconductor device in accordance with the second embodiment of the present invention, the gate 228, the first isolation layer 222, and the substrate 221 play a role as the first capacitor 303 of the pin capacitor, and serve as an upper electrode, a dielectric, and a lower electrode, respectively. The gate 228, the spacer 229, and the plug 236 play a role as the second capacitor 304 of the pin capacitor, and serve as an upper electrode, a dielectric, and a lower electrode, respectively. At this time, the gate 228 is coupled to a pad unit 301, and the plug 236, the pickup area 225, and the substrate 221 are coupled to a ground unit 302, and the entire capacitance of the pin capacitor may be controlled by adjusting the number of gates 228 coupled to the pad unit 301 and the number of plugs 236 coupled to the ground unit 302.

For reference, the substrate 221 is coupled to the ground unit 302 through the pickup area 225. In some cases, however, the substrate 221 may be directly coupled to the ground unit 302 without the pickup area 225.

The pin capacitor of the semiconductor device in accordance with the second embodiment of the present invention includes the second capacitor 304 composed of the plug 236, the spacer 229, and the gate 228 as well as the first capacitor 203. Therefore, the capacitance of the pin capacitor may be increased within the same area. As the first and second capacitors 303 and 304 are coupled in parallel to each other, it can further increase the capacitance of the pin capacitor.

Furthermore, since the third isolation layer 233 is provided to electrically isolate the adjacent plugs 236 from each other, the number of second capacitors 304 increases. Therefore, the appropriate capacitance of the pin capacitor may be obtained.

Accordingly, although the area of the pad is reduced as the integration degree of the semiconductor device increases, the capacitance of the pin capacitor formed under the pad may be further increased as compared to the pin capacitor in accordance with the first embodiment of the present invention. Therefore, noise occurring during power supply and data input/output through the pad may be more effectively reduced. Furthermore, the reliability of the semiconductor device may increase.

Hereafter, a method for fabricating a pin capacitor of a semiconductor device in accordance with a third embodiment of the present invention is described. The method in accordance with the third embodiment of the present invention discloses an example of a method for fabricating the pin capacitor having a structure illustrated in FIGS. 3A and 3B. A method for fabricating the pin capacitor of the semiconductor device in accordance with the second embodiment of the present invention will be explained through the method in accordance with the third embodiment of the present invention.

FIGS. 4A to 4G are cross-sectional views taken along the line X-X' in FIG. 3A, showing the method for fabricating a pin capacitor of a semiconductor device in accordance with the third embodiment of the present invention.

Figure 4A:
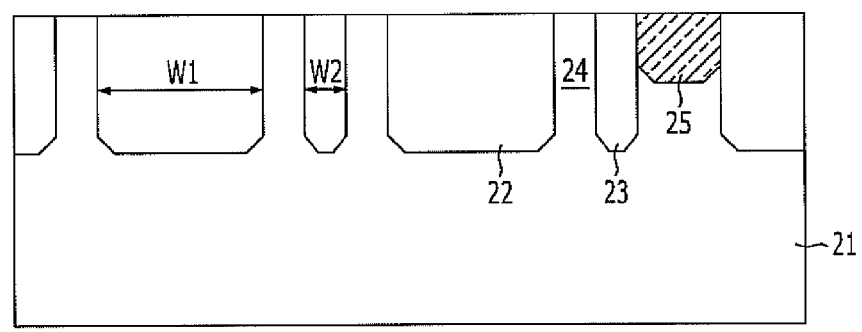
FIGS. 4A to 4G are cross-sectional views taken along the line X-X' of FIG. 3A, showing a method for fabricating a pin capacitor of a semiconductor device in accordance with a third embodiment of the present invention.

Referring to FIG. 4A, first and second isolation layers 22 and 23 having different widths are formed in a substrate 21 to define a line-type dummy active area 24. Furthermore, an area in which a pickup area surrounding the pin capacitor is to be formed is defined at the same time when the dummy active area 24 is defined.

The width W1 of the first isolation layer 22 may be set to be larger than the width W2 of the second isolation layer 23 (W1>W2), and the second isolation layer 23 may be formed to be positioned between the first isolation layers 22. That is, the first and second isolation layers 22 and 23 may be alternately arranged.

A pickup area 25 is formed by implanting ion impurities into the area where the pickup area is to be formed. At this time, the pickup area 25 may be formed in such a ring shape as to surround the pin capacitor. Furthermore, the pickup area 25 has the same conductive type as the substrate 21, and may have a higher impurity doping concentration that that of the substrate 21.

Figure 4B:
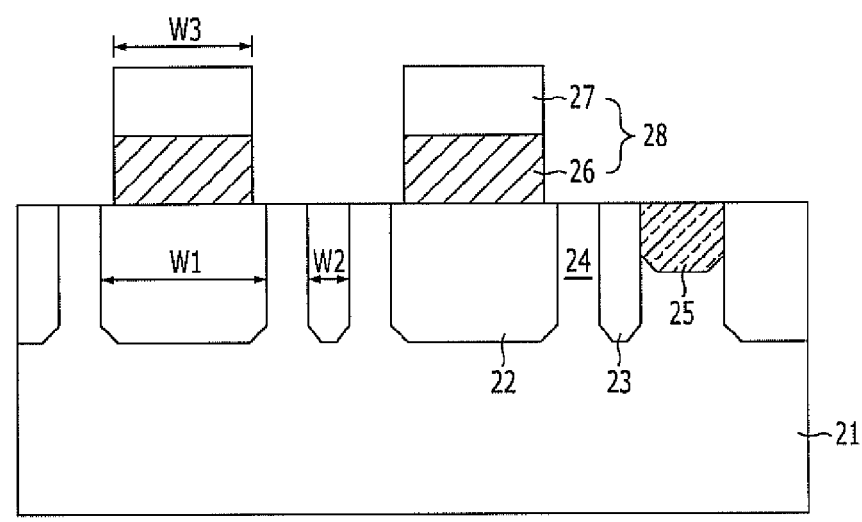

Referring to FIG. 4B, a line-type gate 28 is formed on the first isolation layer 22. At this time, the length of the line-type gate 28 in the extension direction thereof may be equal to that of the line-type dummy active area 24 in the extension direction thereof.

The gate 28 may have a multilayer structure in which a gate electrode 26 and a gate hard mask layer 27 are sequentially stacked. The width W3 of the gate 28 may be set to be smaller than the width W1 of the first isolation layer 22 (W1>W3). In this case, the gate electrode 26 and the dummy active area 24 may be substantially prevented from being electrically coupled to each other.

Meanwhile, although not illustrated, the gate 28 may further include a gate dielectric layer interposed between the first isolation layer 22 and the gate electrode 26.

Figure 4C:
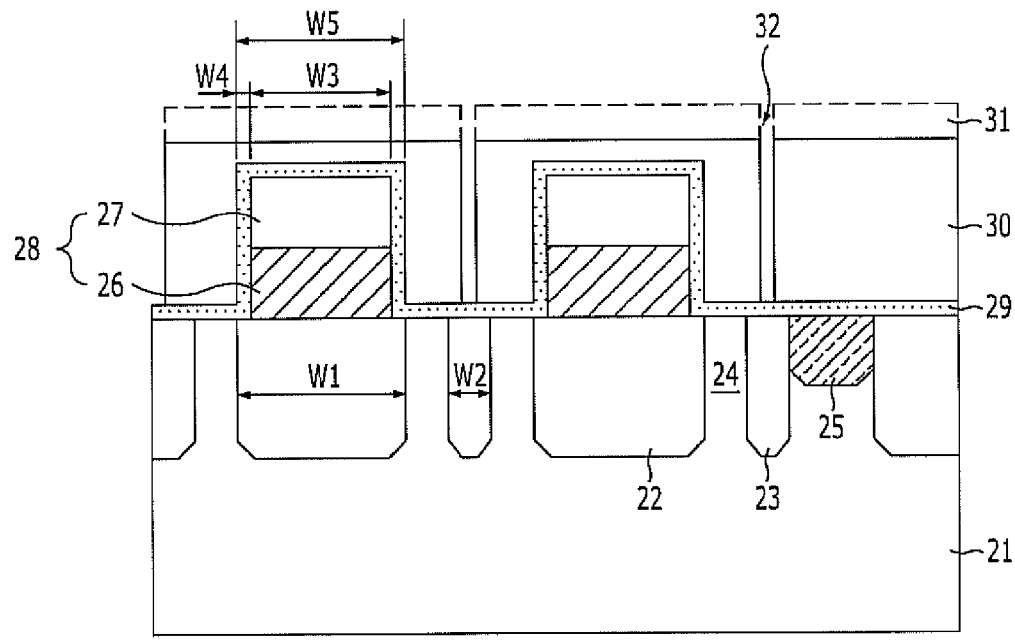

Referring to FIG. 4C, a spacer insulation layer 29 is formed along the surface of the structure including the gate 28. At this time, the spacer insulation layer 29 may include a single layer formed of any one selected from the group consisting of oxide, nitride, and nitrided oxide or a multilayer in which the single layers are stacked, and may be formed of an insulating material having a large dielectric constant, in order to increase the capacitance of the pin capacitor.

Based on the thickness (or width W4) of the spacer insulation layer 29 formed at both sidewalls of the gate 28, the sum of the thickness W4 of the spacer insulation layer 29 and the width W3 of the gate 28 (W3+2×W4) may be set to be smaller than the width W1 of the first isolation layer 22.

A sacrifice layer 30 is formed on the spacer insulation layer 29 so as to cover the entire surface of the substrate 21 including the gate 28. The sacrifice layer 30 may be formed of a material having an etching selectivity with the spacer insulation layer 29. For example, when the spacer insulation layer 29 is formed of nitride, the sacrifice layer 30 may be formed of oxide.

A first photoresist pattern 31 is formed on the sacrifice layer 30, and the sacrifice layer 30 is etched by using the first photoresist pattern 31 as an etching barrier to form a first open area 32 which exposes the spacer insulation layer 29 over the second isolation layer 23.

The first photoresist pattern 31 is removed.

Figure 4D:
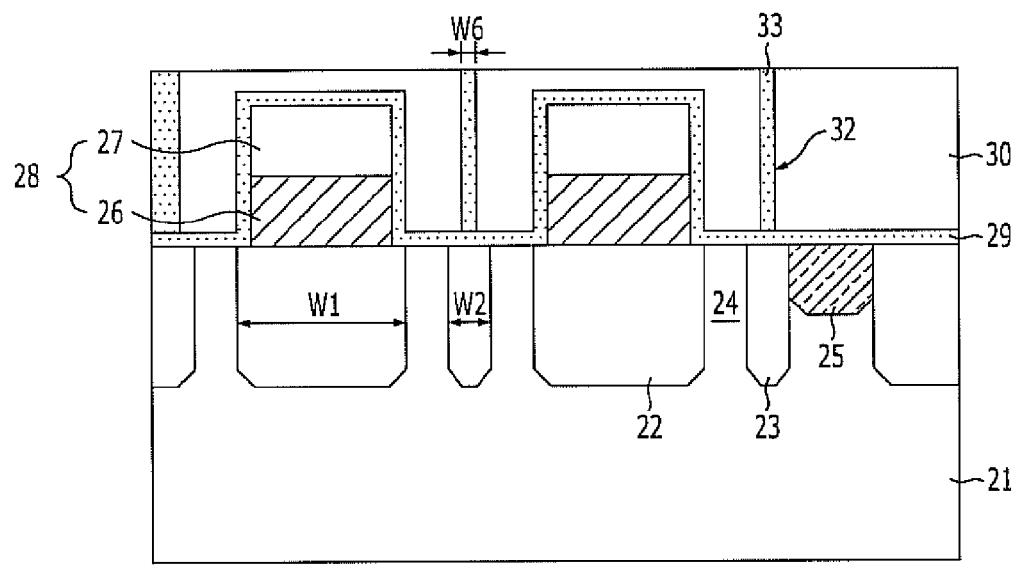

Referring to FIG. 4D, a third isolation layer 33 is formed to fill the first open area 32. The third isolation layer 33 may be formed by a series of processes in which an insulating material is deposited on the entire surface of the substrate 21 so as to fill the first open area 32 and a planarization process is performed until the upper surface of the sacrifice layer 30 is exposed. At this time, the planarization process may be performed by using a chemical mechanical polishing (CMP) process or etchback process.

The third isolation layer 33 may be formed of a material having an etching selectivity with the sacrifice layer 30. For example, when the sacrifice layer 30 is formed of oxide, the third isolation layer 33 may be formed of nitride.

The width W6 of the third isolation layer 32 filling the first open area 32 may be set to be smaller than the width W2 of the second isolation layer 23. In this case, a contact area between the dummy active area 24 and a plug which is to be formed on the dummy active area 24 by a subsequent process may be secured as much as possible.

Figure 4E:
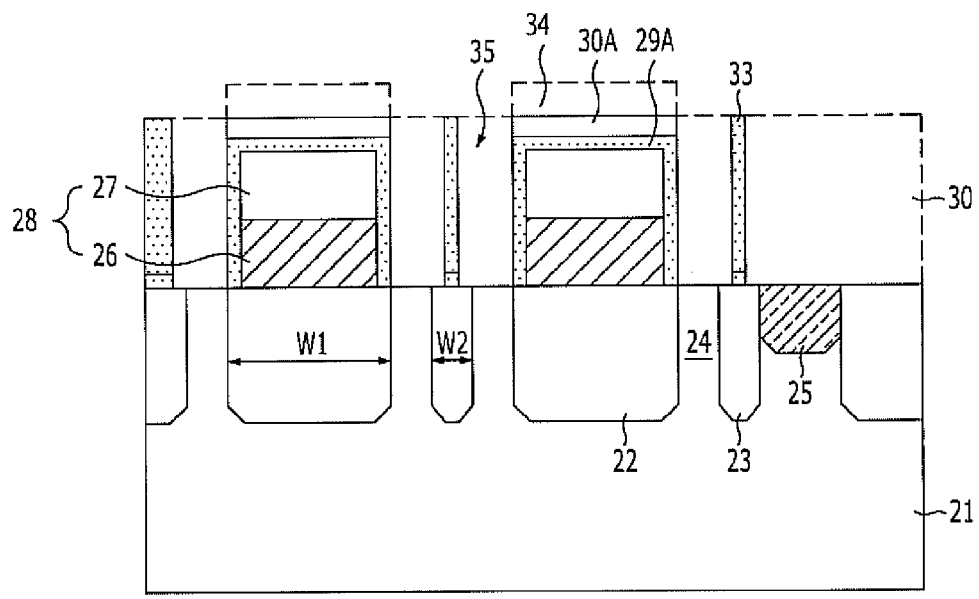

Referring to FIG. 4E, a second photoresist pattern 34 is formed on the sacrifice layer 30, and the sacrifice layer 30 is etched by using the second photoresist pattern 34 as an etching barrier to form a second open area 35 which exposes the upper surface of the dummy active area 24. At this time, a spacer 29A is formed at both sidewalls of the gate 28 at the same time when the second open area 35 is formed.

The sacrifice layer 30 is etched by using the second photoresist pattern 34, which is used for forming the second open area 35 and the spacer 29A, as an etching barrier to expose the spacer insulation layer 29 over the dummy active area 24. Continuously, the spacer insulation layer 29 over the dummy active area 24 is etched to expose the dummy active area 24. At this time, an anisotropic dry etching process for substantially preventing the damage (or loss) of the spacer 29A positioned at the sidewalls of the gate 28 may be performed as the etching process.

The second photoresist pattern 34 is removed.

Hereafter, the remaining sacrifice layer 30 is represented by reference numeral 30A.

Figure 4F:
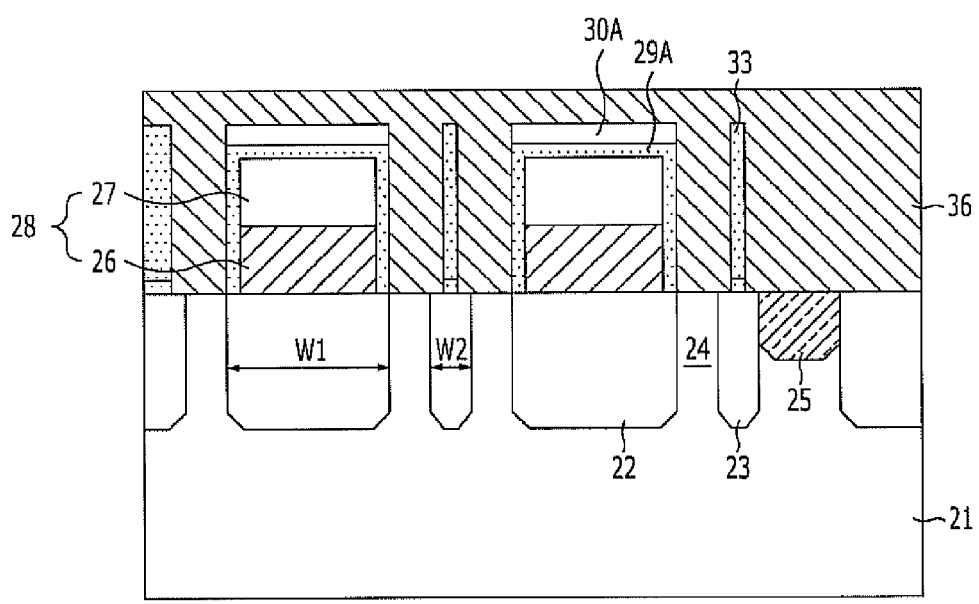

Referring to FIG. 4F, a plug conductive layer 36 is formed on the entire surface of the substrate 31 so as to sufficiently fill the second open area 35. At this time, the plug conductive layer 36 may be formed of a silicon layer or a metallic layer.

Figure 4G:
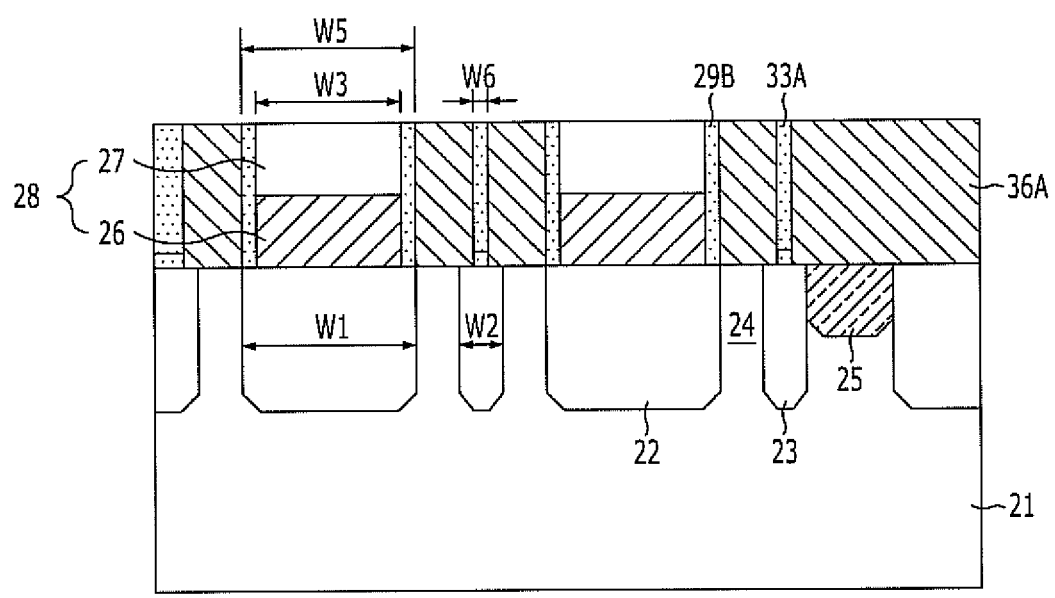

Referring to FIG. 4G, a plurality of plugs 36A are formed by performing a planarization process until the upper surface of the gate 28, or particularly, the upper surface of the gate hard mask layer 27 is exposed. At this time, the plugs 36A may be formed even on the pickup area 25, and bias may be applied to the pickup area 25 through the plugs 36A.

The planarization process may be performed by using a CMP process or etchback process. Through the planarization process, the spacer 29A has a shape to remain only at sidewalls of the gate 28. Hereafter, the remaining spacer 29A is represented by reference numeral 29B.

Although not illustrated, an interconnection process for coupling the gate 28 to a pad unit and an interconnection process for coupling the plug 36A to a ground unit may be performed.

Through the above-described processes, the pin capacitor is implemented to have a first capacitor including the gate 28, the first isolation layer 22, and the substrate 21 and a second capacitor including the plug 36A, the spacer 29B, and the gate 28 coupled in parallel to each other.

In accordance with the embodiments of the present invention, the first capacitor including the gate, the first isolation layer (or the isolation layer), and the substrate and the second capacitor including the gate, the spacer, and the plug are provided. Therefore, the capacitance of the pin capacitor may be increased for the same limited area.

As the first and second capacitors are coupled in parallel to each other, the capacitance of the pin capacitor may increase.

Furthermore, as the third isolation layer is provided to electrically isolate the adjacent plugs from each other, the number of second capacitors is increased. Therefore, the appropriate capacitance of the pin capacitor may be obtained.

Therefore, although the area of the pad is reduced as the integration degree of the semiconductor device increases; it can increase the capacitance of the pin capacitor formed under the pad. Accordingly, noise occurring during power supply and data input/output through the pad may be more effectively reduced. Furthermore, the reliability of the semiconductor device may be increased.

While the present invention has been described with respect to the specific embodiments, it will be apparent to those skilled in the art that various changes and modifications may be made without departing from the spirit and scope of the invention as defined in the following claims.

What is claimed is:

1. A pin capacitor of a semiconductor device, comprising:
   a first isolation layer formed in a substrate and defining a dummy active area;
   a gate formed over the first isolation layer;
   a spacer formed at both sidewalls of the gate; and a plug formed over the dummy active area and in contact with the spacer, wherein the substrate and the plug are coupled to a ground unit, and the gate is coupled to a pad unit.

2. The pin capacitor of claim 1, wherein the gate, the first isolation layer, and the substrate constitute a first capacitor, the gate, the spacer, and the plug constitute a second capacitor, and the first and second capacitor are coupled in parallel to each other.

3. The pin capacitor of claim 1, wherein the gate has a smaller width than the first isolation layer.

4. The pin capacitor of claim 1, further comprising a pickup area formed in the substrate and surrounding the gate.

5. The pin capacitor of claim 4, wherein the pickup area has the same conductive type as the substrate and has a higher impurity doping concentration than that of the substrate.

6. The pin capacitor of claim 4, wherein the plug is extended to the upper portion of the pickup area and coupled to the pickup area.

7. The pin capacitor of claim 1, further comprising:
a second isolation layer formed in the substrate to have a different width from the first isolation layer; and
a third isolation layer formed over the second isolation layer and isolating the adjacent plugs from each other.

8. The pin capacitor of claim 7, wherein the first isolation layer has a larger width than the second isolation layer.

9. The pin capacitor of claim 7, wherein the first and second isolation layers are alternately arranged.

10. The pin capacitor of claim 7, wherein the third isolation layer has a smaller width than the second isolation layer.

11. A pin capacitor of a semiconductor device, comprising:
a substrate having an isolation layer and a dummy active area defined by the isolation layer;
a first capacitor formed between the substrate and a pad of the semiconductor device; and
a second capacitor formed between the pad and a plug formed over the dummy active area,
wherein the first and second capacitors include a gate formed over the isolation area and are coupled in parallel to each other.

12. The pin capacitor of claim 11, wherein, the first capacitor includes the gate, the isolation layer, and the substrate as an upper electrode, a dielectric, and a lower electrode of the first capacitor and the second capacitor includes the gate, a spacer, and the plug as an upper electrode, a dielectric, and a lower electrode of the second capacitor, wherein the spacer is formed on both sidewalls of the gate.

* * * * *